United States Patent
Nakanishi

(10) Patent No.: US 7,026,754 B2
(45) Date of Patent: Apr. 11, 2006

(54) MATRIX SUBSTRATE HAVING WIRING LINES FORMED IN DIFFERENT WIRING LAYERS

(75) Inventor: Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 82 days.

(21) Appl. No.: 10/702,591

(22) Filed: Nov. 7, 2003

(65) Prior Publication Data

US 2004/0121523 A1 Jun. 24, 2004

(30) Foreign Application Priority Data

Nov. 29, 2002 (JP) .............................. 2002-348623

(51) Int. Cl.
*H01J 1/62* (2006.01)
*H01J 63/04* (2006.01)
(52) U.S. Cl. .................. 313/500; 313/506; 257/72; 257/88; 257/93; 345/204
(58) Field of Classification Search ........ 313/500–504; 257/59, 72; 345/76, 204; 349/141, 149, 349/150; 174/255, 260
See application file for complete search history.

(56) References Cited

U.S. PATENT DOCUMENTS

| 4,938,567 | A | * | 7/1990 | Chartier ........................ 359/245 |
| 6,359,606 | B1 | * | 3/2002 | Yudasaka ....................... 345/87 |
| 6,448,710 | B1 | | 9/2002 | Asai et al. .................... 313/504 |
| 6,709,806 | B1 | | 3/2004 | Hotta et al. .................. 430/322 |
| 6,795,345 | B1 | * | 9/2004 | Ooishi .................... 365/185.23 |
| 2005/0073619 | A1 | * | 4/2005 | Chen et al. .................... 349/43 |

FOREIGN PATENT DOCUMENTS

| JP | A-11-24606 | 1/1999 |
| JP | A-2000-100577 | 4/2000 |
| JP | A-2001-345537 | 12/2001 |
| KR | 2000-0023402 | 4/2000 |
| KR | 2001-0094992 | 11/2001 |

* cited by examiner

*Primary Examiner*—Karabi Guharay
*Assistant Examiner*—Sikha Roy
(74) *Attorney, Agent, or Firm*—Oliff & Berridge, PLC

(57) ABSTRACT

To provide a matrix substrate, an electronic apparatus, an electro-optic apparatus, and an electronic unit which can suppress short-circuits between various types of wiring lines adjacent to each other, data lines adjacent to each other are formed alternately in different layers, a first wiring layer ID1 and a second wiring layer ID2.

28 Claims, 11 Drawing Sheets

MATRIX SUBSTRATE HAVING WIRING LINES FORMED IN DIFFERENT WIRING LAYERS

BACKGROUND OF THE INVENTION

1. Field of Invention

The present invention relates to matrix substrates, electronic apparatuses, electro-optic apparatuses, and electronic units.

2. Description of Related Art

In the related art display apparatuses which use organic EL elements use active-matrix display apparatuses having a driving transistor for controlling an organic EL element in each pixel circuit.

In the active-matrix display apparatuses, a plurality of scanning lines and a plurality of data lines connected to the pixel circuits are formed. Also in the active-matrix display apparatuses, a plurality of power lines for supplying driving voltages to the driving transistors are formed.

These type of the display apparatuses have a multi-layer wiring structure (for example, see Japanese Unexamined Patent Application Publication No. Hei-11-024606) in which the scanning lines, the data lines, and the power lines are formed in a plurality of wiring layers.

When the scanning lines are formed, scanning lines formed adjacent to each other may be short-circuited due to a mixture of impurities or other reasons. In the same way, when the data lines are formed, data lines formed adjacent to each other may be short-circuited due to a mixture of impurities or other reasons. Further, in the same way, when the power lines are formed, power lines formed adjacent to each other may be short-circuited due to a mixture of impurities or other reasons. In addition, when a plurality of wiring lines are formed in the same wiring layer, wiring lines may be short-circuited due to a mixture of impurities or other reasons. As a result, the yield of the display apparatuses is reduced.

As finer pitches have been used, there has been a demand that pixel circuits be disposed at a high density. At a high density, as described above, scanning lines, data lines, and power lines each may be short-circuited in more cases when manufactured.

SUMMARY OF THE INVENTION

The present invention has been made to address the above-described problems. The present invention provides a matrix substrate, an electronic apparatus, an electro-optic apparatus, and an electronic unit which can suppress short-circuits between various types of wiring lines adjacent to each other.

A matrix substrate according to an aspect of the present invention is a matrix substrate having a plurality of first wiring lines, at least part of at least one first wiring line of the plurality of first wiring lines being formed in a layer different from a layer where the other first wiring lines of the plurality of first wiring lines are formed.

With this, when the plurality of first wiring lines are formed in different wiring layers, the wiring pitch between first wiring lines adjacent to each other can be made larger in a layer. Therefore, even if impurities are mixed, short circuits between first wiring lines can be suppressed when the first wiring lines are formed.

The matrix substrate may be configured such that it further includes a plurality of second wiring lines, and the at least part of at least one first wiring line is formed in the same layer as the plurality of second wiring lines.

With this, the wiring pitch between the first wiring lines can be made larger in the matrix substrate provided with the plurality of first wiring lines and the plurality of second wiring lines.

In the matrix substrate, at least either of the plurality of first wiring lines and the plurality of second wiring lines may be formed alternately in a plurality of different layers.

With this, the wiring pitch between the first wiring lines and the wiring pitch between the second wiring lines can be made larger. Therefore, when the first wiring lines and the second wiring lines are formed, even if impurities are mixed, short circuits between the first wiring lines and short circuits between the second wiring lines can be suppressed.

In the matrix substrate, the plurality of first wiring lines and the plurality of second wiring lines may be formed so as to be perpendicular to each other.

With this, the wiring pitch between the first wiring lines or the wiring pitch of the second wiring lines can be made larger in the matrix substrate in which the first wiring lines and the second wiring lines are formed so as to be perpendicular to each other.

In the matrix substrate, at each of the positions where the plurality of first wiring lines and the plurality of second wiring lines intersect, an electronic circuit connected to the first wiring line and the second wiring line may be provided.

With this, the wiring pitch between the first wiring lines or the wiring pitch of the second wiring lines can be made larger in the active-matrix substrate provided with the electronic circuits disposed in a matrix manner at the positions where the first wiring lines and the second wiring lines intersect.

A matrix substrate according to an aspect of the present invention is a matrix substrate including a plurality of scanning lines and a plurality of data lines, at least part of at least one scanning line of the plurality of scanning lines being formed in a wiring layer different from a wiring layer where the other scanning lines are formed.

With this, when the plurality of scanning lines are formed in different wiring layers, the wiring pitch of scanning lines adjacent to each other can be made larger. Therefore, when the scanning lines are formed, even if impurities are mixed, short circuits between the scanning lines can be suppressed.

A matrix substrate according to an aspect of the present invention is a matrix substrate including a plurality of scanning lines and a plurality of data lines, at least part of at least one data line of the plurality of data lines being formed in a wiring layer different from a wiring layer where the other data lines are formed.

With this, when the plurality of data lines are formed in different wiring layers, the wiring pitch of data lines adjacent to each other can be made larger. Therefore, when the data lines are formed, even if impurities are mixed, short circuits between the data lines can be suppressed.

A matrix substrate according to an aspect of the present invention is a matrix substrate including a plurality of scanning lines, a plurality of data lines, and a plurality of power lines, at least part of at least one power line of the plurality of power lines being formed in a wiring layer different from a wiring layer where the other power lines are formed.

With this, when the plurality of power lines are formed in different wiring layers, the wiring pitch of power lines adjacent to each other can be made larger. Therefore, when the power lines are formed, even if impurities are mixed, short circuits between the power lines can be suppressed.

In the matrix substrate, at least one of the plurality of scanning lines, the plurality of data lines, and the plurality of power lines may be formed alternately in a plurality of different layers.

With this, when any of the plurality of scanning lines, the plurality of data lines, and the plurality of power lines are formed in different wiring layers, the wiring pitch of the scanning lines adjacent to each other, the wiring pitch of the data lines adjacent to each other, or the wiring pitch of the power lines adjacent to each other can be made larger.

In the matrix substrate, the plurality of scanning lines and the plurality of data lines may be formed so as to be perpendicular to each other.

With this, the wiring pitch between the scanning lines or the wiring pitch of the data lines can be made larger in the matrix substrate in which the scanning lines and the data lines are formed so as to be perpendicular to each other.

In the matrix substrate, at each of positions where the plurality of scanning lines and the plurality of data lines intersect, an electronic circuit connected to the scanning line and the data line may be provided.

With this, the wiring pitch between the scanning lines or the wiring pitch of the data lines can be made larger in the active-matrix substrate provided with the electronic circuits disposed in a matrix manner at the positions where the scanning lines and the data lines intersect. According to this, since short circuits between the scanning lines or between the data lines in the active-matrix substrate can be suppressed, the yield of the active-matrix substrate is enhanced.

An electronic apparatus according to an aspect of the present invention is an electronic apparatus including a substrate provided with a plurality of first wiring lines, and electronic elements driven by signals or power supplied through the plurality of first wiring lines, at least one first wiring line of the plurality of first wiring lines being formed in a layer different from a layer where the other first wiring lines are formed.

With this, in an electronic apparatus having a plurality of first wiring lines, when the plurality of first wiring lines are formed in different wiring layers, the wiring pitch between first wiring lines adjacent to each other can be made larger. Therefore, when the first wiring lines are formed, even if impurities are mixed, short circuits between first wiring lines can be suppressed. Consequently, the yield of the electronic apparatus is enhanced.

The electronic apparatus may be configured such that it further includes a plurality of second wiring lines, and the at least part of at least one first wiring line is formed in the same layer as the plurality of second wiring lines.

With this, the wiring pitch between the first wiring lines can be made larger in the matrix substrate provided with the plurality of first wiring lines and the plurality of second wiring lines.

In the electronic apparatus, at least either of the plurality of first wiring lines and the plurality of second wiring lines may be formed alternately in a plurality of different wiring layers.

With this, the wiring pitch between the first wiring lines and the wiring pitch between the second wiring lines can be made larger. Therefore, when the first wiring lines and the second wiring lines are formed, even if impurities are mixed, short circuits between the first wiring lines and short circuits between the second wiring lines can be suppressed.

In the electronic apparatus, the plurality of first wiring lines and the plurality of second wiring lines may be formed so as to be perpendicular to each other.

With this, the wiring pitch between the first wiring lines or the wiring pitch of the second wiring lines can be made larger in the matrix substrate in which the first wiring lines and the second wiring lines are formed so as to be perpendicular to each other.

In the electronic apparatus, at each of positions where the plurality of first wiring lines and the plurality of second wiring lines intersect, an electronic circuit connected to the first wiring line and the second wiring line, to control the electronic element may be provided.

With this, the wiring pitch of the first or second wiring lines can be made larger, both lines supplying various signals to the electronic circuits disposed in a matrix manner at the positions where the first wiring lines and the second wiring lines intersect.

The electronic apparatus may be configured such that the plurality of first wiring lines are signal lines, and the plurality of second wiring lines are power lines.

With this, the wiring pitch between the signal lines or the wiring pitch between the power lines can be made larger.

In the electronic apparatus, the signal lines may be selection lines to output selection signals to select the electronic circuits.

With this, the wiring pitch between the selection lines to select a plurality of electronic circuits disposed in a matrix manner can be made larger.

In the electronic apparatus, the signal lines may be data lines to output data signals to the electronic circuits.

With this, the wiring pitch between the data lines to output the data signals to a plurality of electronic circuits disposed in a matrix manner can be made larger.

The electronic apparatus may be configured such that the electronic circuits are formed in an element forming layer formed on the substrate, and the plurality of wiring layers are formed at the upper side of the element forming layer.

With this, in the electronic apparatus having the structure provided with, on the substrate, the element forming layer in which the electronic circuits are formed, and also provided with, at the upper side of the element forming layer, the plurality of wiring layers in which the first wiring lines are formed, the pitch of the first wiring lines formed in the plurality of wiring layers can be made larger. When the electronic apparatus having the above-described structure is formed, short circuits between the first wiring lines, caused by the mixture of impurities can be suppressed. Therefore, the yield of the electronic apparatus having the above-described structure is enhanced.

In the electronic apparatus, the electronic elements may be formed at the upper side of the plurality of wiring layers, correspondingly to the electronic circuits.

With this, short circuits between wiring lines in the electronic apparatus provided with the electronic elements at the upper side of the plurality of wiring layers can be suppressed.

In the electronic apparatus, the electronic elements may be electro-optic elements or elements driven by current.

With this, short circuits between wiring lines in the electronic apparatus provided with the electro-optic elements or the elements driven by current can be suppressed.

An electro-optic apparatus according to an aspect of the present invention is an electro-optic apparatus including a plurality of scanning lines, a plurality of data lines, a plurality of power lines, and a plurality of electro-optic elements, at least part of at least one scanning line of the plurality of scanning lines being formed in a layer different from a layer where the other scanning lines are formed.

With this, when the plurality of scanning lines formed in the electro-optic apparatus are formed in different wiring layers, the wiring pitch between adjacent scanning lines can be made larger.

Therefore, when the scanning lines are formed, even if impurities are mixed, short circuits between the scanning lines can be suppressed. As a result, the yield of the electro-optic apparatus is enhanced.

An electro-optic apparatus according to an aspect of the present invention is an electro-optic apparatus including a plurality of scanning lines, a plurality of data lines, a plurality of power lines, and a plurality of electro-optic elements, at least part of at least one data line of the plurality of data lines being formed in a layer different from a layer where the other data lines are formed.

With this, when the plurality of data lines formed in the electro-optic apparatus are formed in different wiring layers, the wiring pitch between adjacent data lines can be made larger. Therefore, when the data lines are formed, even if impurities are mixed, short circuits between the data lines can be suppressed. As a result, the yield of the electro-optic apparatus is enhanced.

An electro-optic apparatus according to an aspect of the present invention is an electro-optic apparatus including a plurality of scanning lines, a plurality of data lines, a plurality of power lines, and a plurality of electro-optic elements, at least part of at least one power line of the plurality of power lines being formed in a layer different from a layer where the other power lines are formed.

With this, when the plurality of power lines formed in the electro-optic apparatus are formed in different wiring layers, the wiring pitch between adjacent power lines can be made larger.

Therefore, when the power lines are formed, even if impurities are mixed, short circuits between the power lines can be suppressed. As a result, the yield of the electro-optic apparatus is enhanced.

In the electro-optic apparatus, the plurality of data lines and the plurality of scanning lines may be formed so as to be perpendicular to each other.

With this, the wiring pitch between the scanning lines or the wiring pitch of the data lines can be made larger in the electro-optic apparatus in which the scanning lines and the data lines are formed so as to be perpendicular to each other.

In the electro-optic apparatus, at least one of the plurality of data lines, the plurality of scanning lines, and the plurality of power lines may be formed alternately in a plurality of different wiring layers.

With this, when any of the plurality of scanning lines, the plurality of data lines, and the plurality of power lines is formed in different wiring layers, the wiring pitch of the scanning lines adjacent to each other, the wiring pitch of the data lines adjacent to each other, or the wiring pitch of the power lines adjacent to each other can be made larger.

In the electro-optic apparatus, at positions where the plurality of scanning lines and the plurality of data lines intersect, a plurality of electronic circuits connected to the scanning lines and the data lines, to control the electro-optic elements are provided.

With this, the wiring pitch between the scanning lines or the data lines can be made larger, both lines formed in an active-matrix substrate provided with the electronic circuits disposed in a matrix manner at the positions where the scanning lines and the data lines intersect. Therefore, the yield of the active-matrix electro-optic apparatus is enhanced.

The electro-optic apparatus may be configured such that the plurality of electronic circuits are formed in an element forming layer formed on the substrate, and the plurality of wiring layers are formed at the upper side of the element forming layer.

With this, in the electro-optic apparatus having the structure provided with, on the substrate, the element forming layer in which the electronic circuits are formed, and also provided with the scanning lines, the data lines, and the power lines at the upper side of the element forming layer, the wiring pitch of the scanning lines, the wiring pitch of the data lines, and the wiring pitch of the power lines can be made larger, all of which are formed in the plurality of wiring layers. Therefore, when the electronic apparatus having the above-described structure is formed, short circuits between the scanning lines, between the data lines, and between the power lines, caused by the mixture of impurities can be suppressed. As a result, the yield of the electronic apparatus having the above-described structure is enhanced.

In the electro-optic apparatus, the plurality of electronic circuits may be electronic circuits to drive the electro-optic elements formed correspondingly to the electronic circuits at the upper side of the plurality of wiring layers.

With this, short circuits between the scanning lines, between the data lines, and between the power lines in the electro-optic apparatus provided with the electro-optic elements at the upper side of the plurality of wiring layers can be suppressed.

In the electro-optic apparatus, the electro-optic elements may be EL elements.

With this, short circuits between the scanning lines, between the data lines, and between the power lines to control the EL elements can be suppressed.

In the electro-optic apparatus, the EL elements may be organic EL elements in which light-emitting layers are made from an organic material.

With this, the yield of the electro-optic apparatus provided with the organic EL elements can be enhanced.

The above-described electronic apparatus is mounted in an electronic unit according to an aspect of the present invention.

With this, the yield of the electronic unit to which the electronic apparatus in which short circuits caused by impurities can be suppressed by making the wiring pitch larger is mounted is enhanced.

The above-described electro-optic apparatus is mounted in an electronic unit according to an aspect of the present invention.

With this, the yield of the electronic unit to which the electro-optic apparatus in which short circuits caused by impurities can be suppressed by making the wiring pitch larger is mounted is enhanced.

DETAILED DESCRIPTION OF PREFERRED EMBODIMENTS

FIRST EXEMPLARY EMBODIMENT

Figure 1:
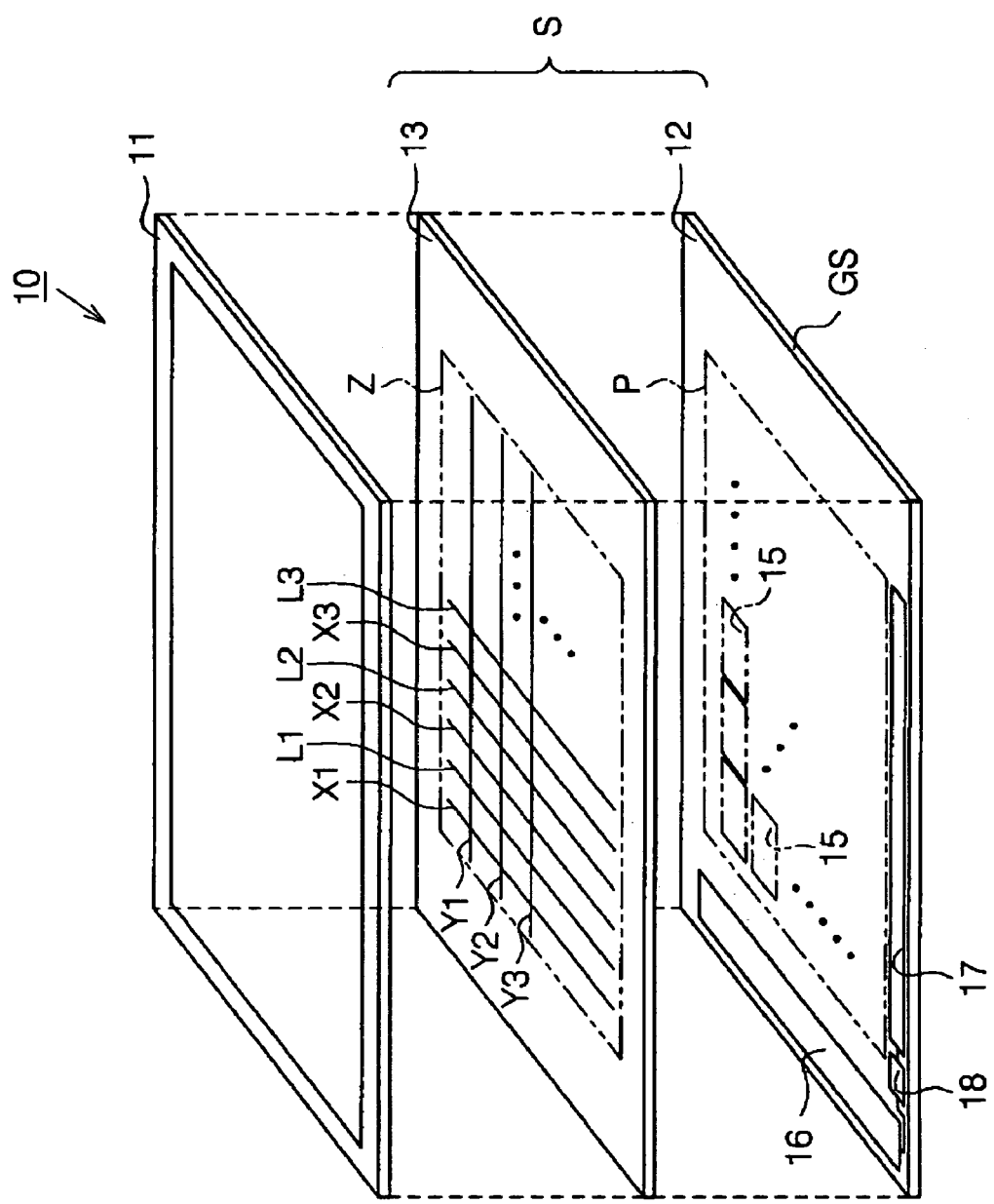
FIG. 1 is an exploded perspective view of an organic EL display according to a first exemplary embodiment.
Figure 2:
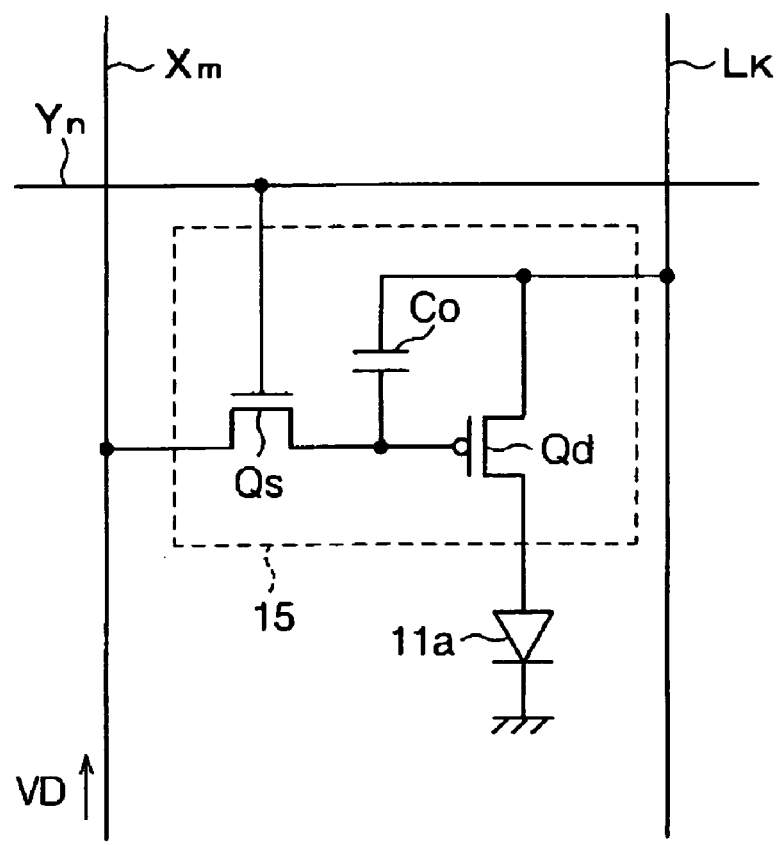
FIG. 2 is a circuit schematic of a pixel circuit.
Figure 3:
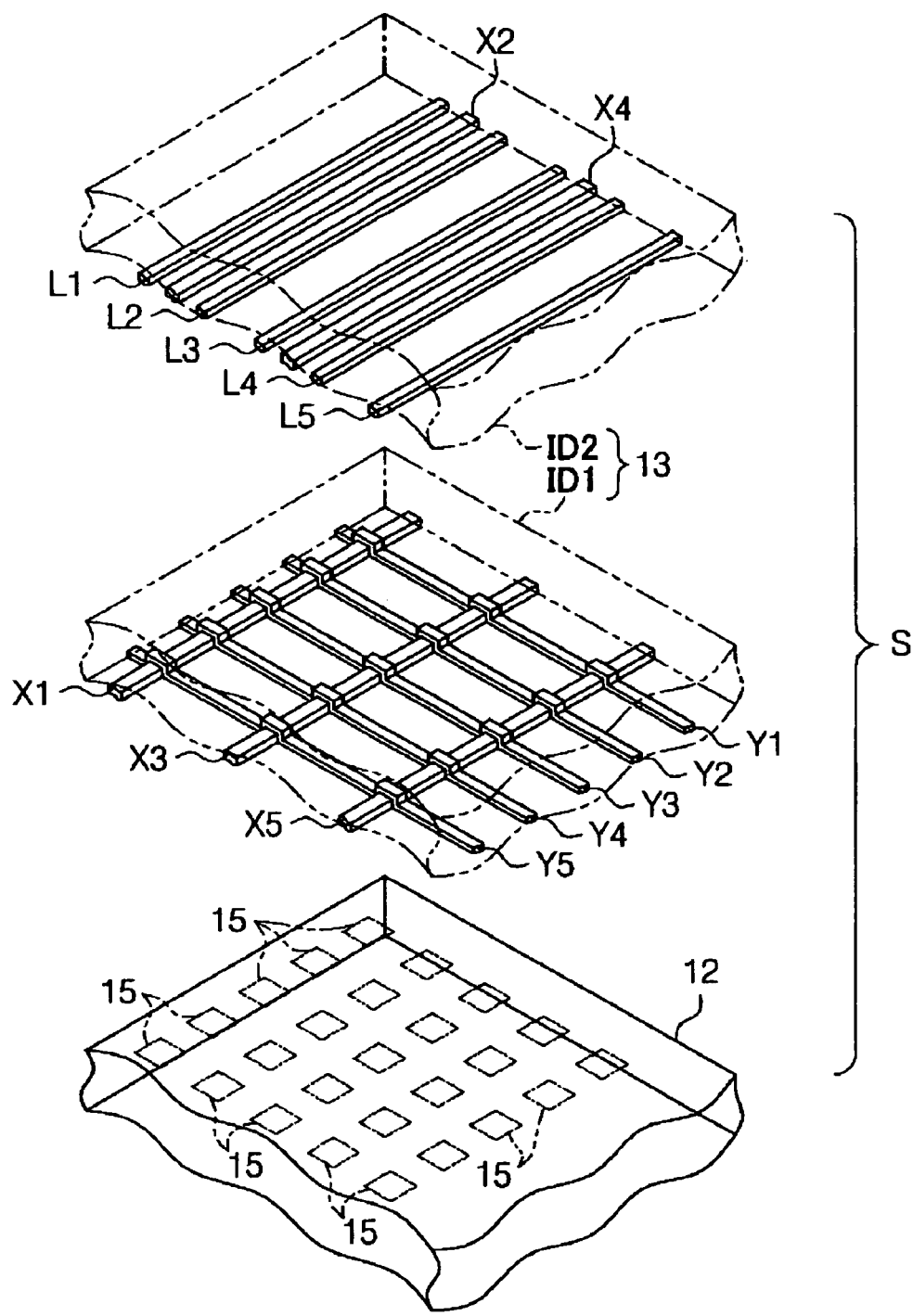
FIG. 3 is a partial exploded perspective view of a wiring forming layer and an element forming layer according to the first exemplary embodiment.

A first exemplary embodiment of the present invention will be described below by referring to FIG. 1 to FIG. 5. FIG. 1 is an exploded perspective view of an organic EL display. FIG. 2 is a circuit schematic of a pixel circuit. FIG. 3 is a partial exploded perspective view of a wiring layer and an element forming layer.

The present exemplary embodiment shows just an aspect of the present invention, and does not limit the present invention. Within the scope of the technical concept of the present invention, it can be modified in a desired way. Figures shown below may have different scales for layers and members in order to illustrate the layers and the members with recognizable sizes.

An organic EL display 10 is formed of an EL forming layer 11 and a substrate S as shown in FIG. 1. The EL forming layer 11 is a forming layer in which a plurality of organic EL elements 11a (see FIG. 2) having light emitting layers made from an organic material are formed in a matrix manner. The substrate S has a multi-layer wiring structure in which an element forming layer 12 and a wiring layer 13 are laminated. The substrate S is an active-matrix substrate in which a plurality of pixel circuits 15 is formed in a matrix manner in the element forming layer 12.

To describe in detail, the element forming layer 12 is formed on a glass substrate GS, and an element forming area P is formed almost at the center thereof. In the element forming area P, the plurality of pixel circuits 15 to control the organic EL elements 11a are disposed in a matrix manner.

The element forming layer 12 is provided with a scanning-line driving circuit 16 at the left-hand side, in the figure, of the element forming area P. In addition, the element forming layer 12 is provided with a data-line driving circuit 17 at the lower side, in the figure, of the element forming area P. The data-line driving circuit 17 has a plurality of single-line drivers 17a in its inside (see FIG. 6). The element forming layer 12 is also provided with a control circuit 18. The control circuit 18 is electrically connected to the scanning-line driving circuit 16 and to the data-line driving circuit 17, and is also connected to an external apparatus, not shown.

A pixel circuit 15 formed in the element forming area P is formed of a driving transistor Qd, a switching transistor Qs, and a holding capacitor Co, as shown in FIG. 2. In the present exemplary embodiment, the driving transistor Qd is a p-type TFT, and the switching transistor Qs is an n-type TFT.

The holding capacitor Co is connected between the gate and source of the driving transistor Qd. The gate of the driving transistor Qd is connected to a data line Xm, described later, through the switching transistor Qs. The switching transistor Qs is electrically connected to a single-line driver 17a in the data-line driving circuit 17 through the data line Xm. The gate of the switching transistor Qs is electrically connected to the scanning-line driving circuit 16 through a scanning line Yn, described later. The source of the driving transistor Qd is connected to a power line Lk, described later. The drain of the driving transistor Qd is connected to the anode of the organic EL element 11a through a wiring line, not shown, formed through the wiring layer 13.

In the present exemplary embodiment, the pixel circuit 15 is formed of the driving transistor Qd, the switching transistor Qs, and the holding capacitor Co shown in FIG. 2. The structure of the pixel circuit 15 is not limited to this case, and may be modified, if necessary.

In the wiring layer 13, various wiring lines to electrically connect the EL forming layer 11 and the element forming layer 12 are formed. The scanning line Yn and the data line Xm serving as selection lines to electrically connect the scanning-line driving circuit 16 and the data-line driving circuit 17 to the pixel circuit 15, all formed on the element forming layer 12, are formed in the wiring layer 13.

A wiring forming area Z is formed in the wiring layer 13 at the position corresponding to that of the element forming area P of the element forming layer 12. In the wiring forming area Z, a plurality of scanning lines Yn (n: natural number) to electrically connect the pixel circuits 15 and the scanning-line driving circuit 16, both formed in the element forming layer 12, are formed in the row direction of the pixel circuits 15, formed in a matrix manner. Also in the wiring forming area Z, a plurality of data lines Xm (m: natural number) to electrically connect the pixel circuits 15 and the data-line driving circuit 17, both formed in the element forming layer 12, are formed in the column direction of the pixel circuits 15, formed in a matrix manner. In other words, the plurality of scanning lines Yn and the plurality of data lines Xm are formed so as to be perpendicular to each other. At each of positions where the plurality of scanning lines Yn and the plurality of data lines Xm intersect perpendicularly, a pixel circuit 15 connected to the scanning line Yn and the data line Xm is formed.

The scanning lines Yn are disposed in the order of a first scanning line Y1, a second scanning line Y2, a third scanning line Y3, . . . from the upper-end side (the side opposite the side where the data-line driving circuit 17 is formed in the element forming layer 12) of the wiring forming area Z. The first scanning line Y1 corresponds to a pixel-circuit group 15 formed in the row direction at the side opposite the side where the data-line driving circuit 17 is formed on the element forming area P. The data lines Xm are disposed in the order of a first data line X1, a second data line X2, a third data line X3, . . . from the left-end side (the side where the scanning-line driving circuit 16 is formed in the element forming layer 12) of the wiring forming area Z. The first data line X1 corresponds to a pixel-circuit group 15 formed in the column direction at the side where the scanning-line driving circuit 16 is formed on the element forming area P.

Further, a plurality of power lines Lk (k: natural number) are formed in parallel to the data lines Xm in the wiring forming area Z. The power lines Lk are disposed in the order of a first power line L1, a second power line L2, a third power line L3, . . . from the left-end side of the wiring forming area Z. Also in the wiring forming area Z, various wiring lines not shown to electrically connect the EL forming layer 11 and the element forming layer 12 are formed.

To describe in detail, the wiring layer 13 is formed of a first wiring layer ID1 and a second wiring layer ID2, as shown in FIG. 3. The first wiring layer ID1 is formed on the element forming layer 12, and the second wiring layer ID2 is formed on the first wiring layer ID1.

In the first wiring layer ID1, among the data lines Xm, the scanning lines Yn, and the power lines Lk, all of the scanning lines Yn are formed. Among the plurality of data lines Xm, the first data line X1, the third data line X3, a fifth data line X5, . . . are also formed in the first wiring layer ID1. In the second wiring layer ID2, among the data lines Xm, the scanning lines Yn, and the power lines Lk, all of the power lines Lk are formed. Among the plurality of data lines Xm, the second data line X2, a fourth data line X4, . . . are also formed in the second wiring layer ID2.

In other words, data lines Xm adjacent to each other are alternately formed in the first wiring layer ID1 and the second wiring layer ID2. In the second wiring layer, the second data line X2 is formed between the first power line L1 and the second power line L2, and the fourth data line X4 is formed between the third power line L3 and a fourth power line L4. In the same way, a sixth data line X6, an eighth data line X8, . . . , not shown, are formed between the corresponding power lines Lk. The pixel circuits 15 are formed at the positions where the data lines Xm and the scanning lines Yn intersect.

Figure 4:
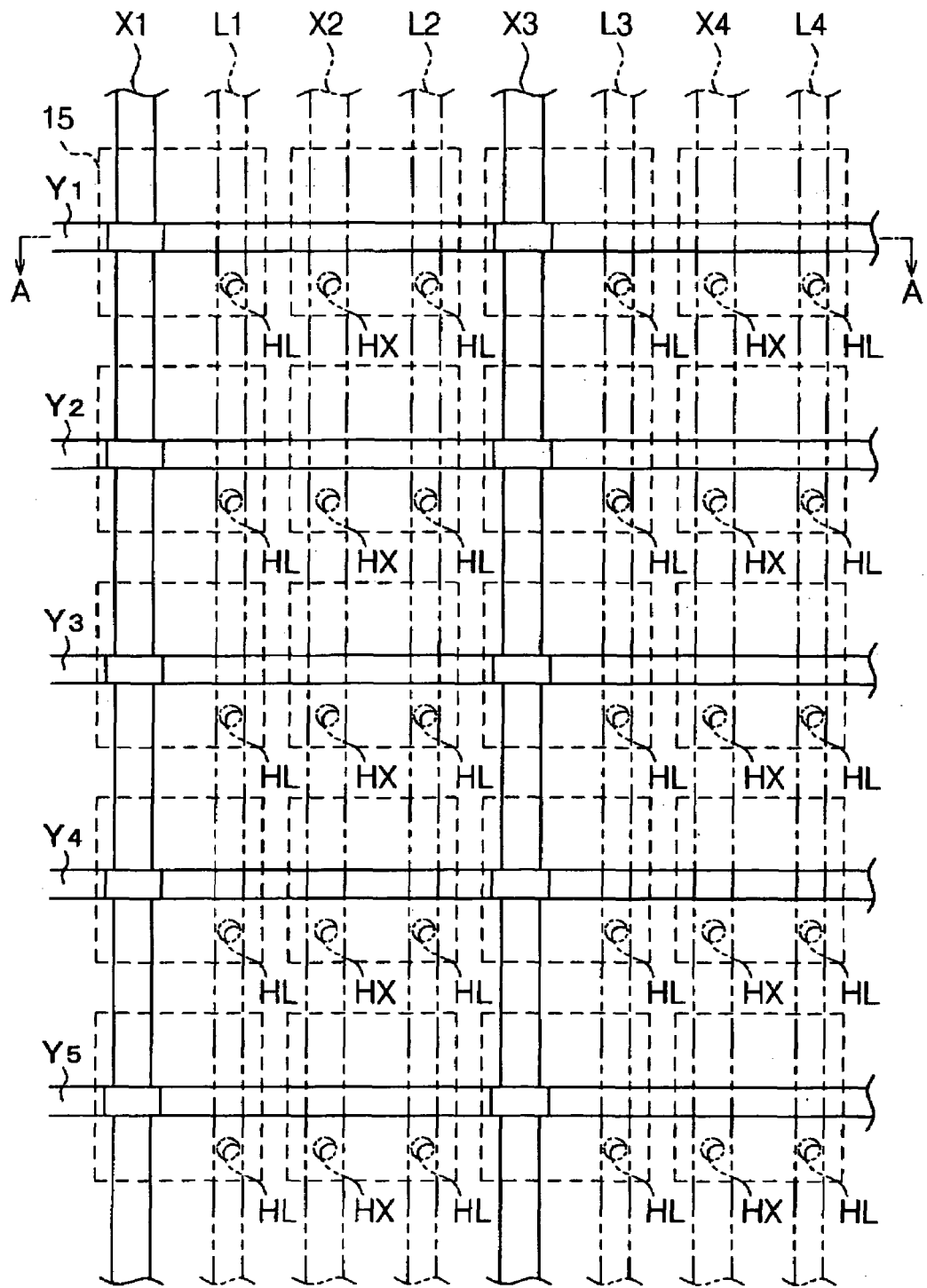
FIG. 4 is a partial top view of the wiring layer and the element forming layer according to the first exemplary embodiment.

FIG. 4 is a partial top view of the element forming layer 12 and the wiring layer 13 structured as described above. In FIG. 4, members indicated by solid lines are formed in the first wiring layer ID1, and members indicated by two-dot chain lines are formed in the second wiring layer ID2. Dotted lines indicate pixel circuits 15 formed in the element forming layer 12.

The second data line X2, the fourth data line X4, . . . formed in the second wiring layer ID2 have data-line contact holes HX formed through the first wiring layer ID1 at positions where the corresponding pixel circuits 15 are formed. The second data line X2, the fourth data line X4, . . . are electrically connected to the switching transistors Qs constituting the corresponding pixel circuits 15, through the data-line contact holes HX. The first data line X1, the third data line X3, the fifth data line X5, . . . formed in the first wiring layer ID1 are directly connected to the switching transistors Qs constituting the corresponding pixel circuits 15.

The power lines Lk formed in the second wiring layer ID2 are electrically connected to the sources of the driving transistors Qd constituting the corresponding pixel circuits 15 through power-line contact holes HL formed through the first wiring layer ID1 at positions where the corresponding pixel circuits 15 are formed. The power lines Lk are electrically connected to the sources of the driving transistors Qd constituting the corresponding pixel circuits 15 through the power-line contact holes HL.

Each scanning line Yn is connected to the scanning-line driving circuit 16 by a connection section not shown. In the same way, each data line Xm is connected to the data-line driving circuit 17 by a connection section not shown.

Figure 5:
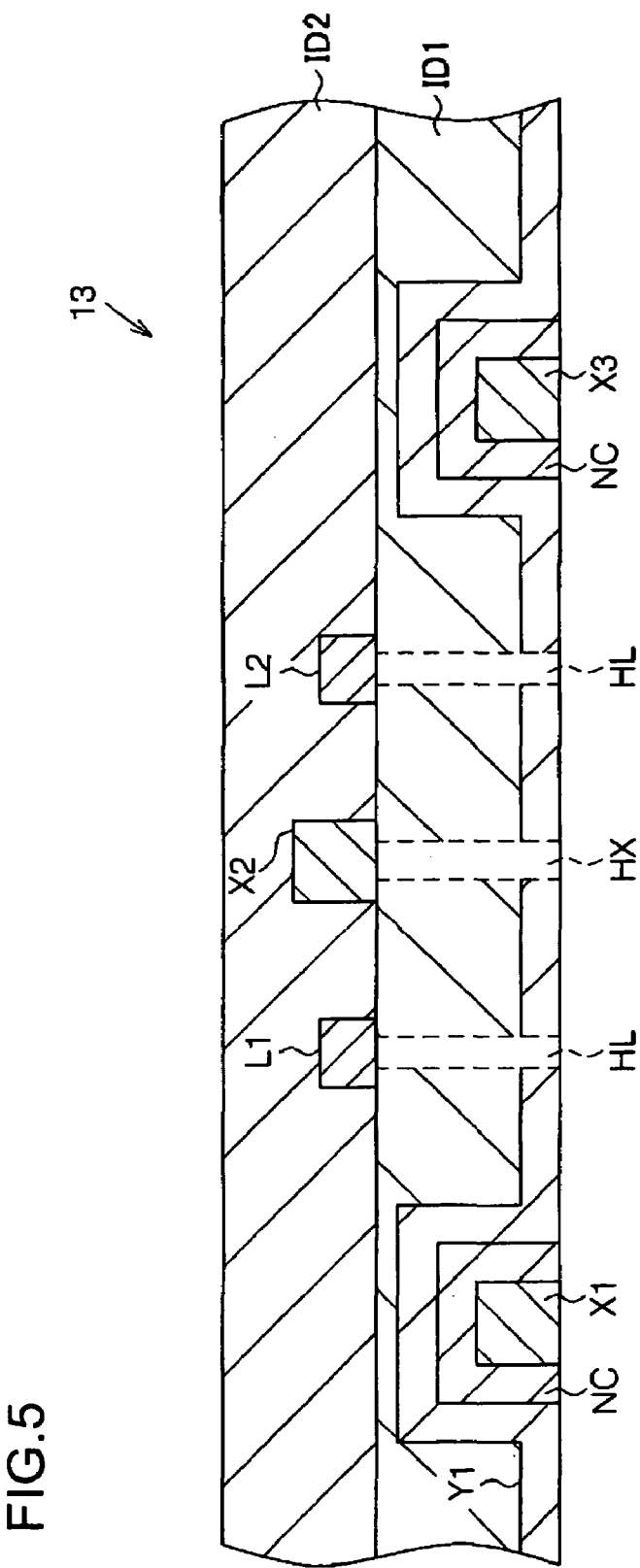
FIG. 5 is a partial cross section of a first wiring layer and a second wiring layer.

FIG. 5 is a partial cross section of the wiring layer 13. In the first wiring layer ID1, as described before, the first data line X1, the third data line X3, . . . are formed at the positions corresponding to the drains of the switching transistors Qs. Insulating layers NC are formed at the intersections of the first scanning line Y1 formed in the first wiring layer ID1 and the first data line X1, the third data line X3, . . . . The insulating layers NC electrically insulates the first scanning line Y1 from the first data line X1, the third data line X3, . . . .

In the second wiring layer ID2, formed on the first wiring layer ID, the second data line X2, the fourth data line X4, . . . are formed at positions corresponding to the drains of the corresponding switching transistors Qs. The second data line X2 has the data-line contact hole HX passing through the first wiring layer ID1, as indicated by dotted lines in FIG. 5. In the same way, the fourth data line X4, the sixth data line X6, . . . formed in the second wiring layer ID2 have the data-line contact holes HX passing through the first wiring layer ID1. The second data line X2, the fourth data line X4, . . . formed in the second wiring layer ID2 are electrically connected to the drains of the corresponding switching transistors Qs through the data-line contact holes HX.

When the substrate S and the organic EL display 10 having the substrate S are structured in this way, the data lines Xm formed adjacently to each other in the wiring layer 13 can be alternately formed in the first wiring layer ID1 and the second wiring layer ID2. As a result, the data lines Xm can be formed with their wiring pitch being made larger to be doubled than in a case in which all the data lines Xm are formed in one wiring layer. Therefore, when the data lines Xm are formed, short circuits between data lines Xm formed adjacently to each other, caused by a mixture of impurities can be suppressed. As a result, the yields of the substrate S and the organic EL display 10 having the substrate S are enhanced.

The electrical structure of the organic EL display 10 structured in this way will be described next.

Figure 6:
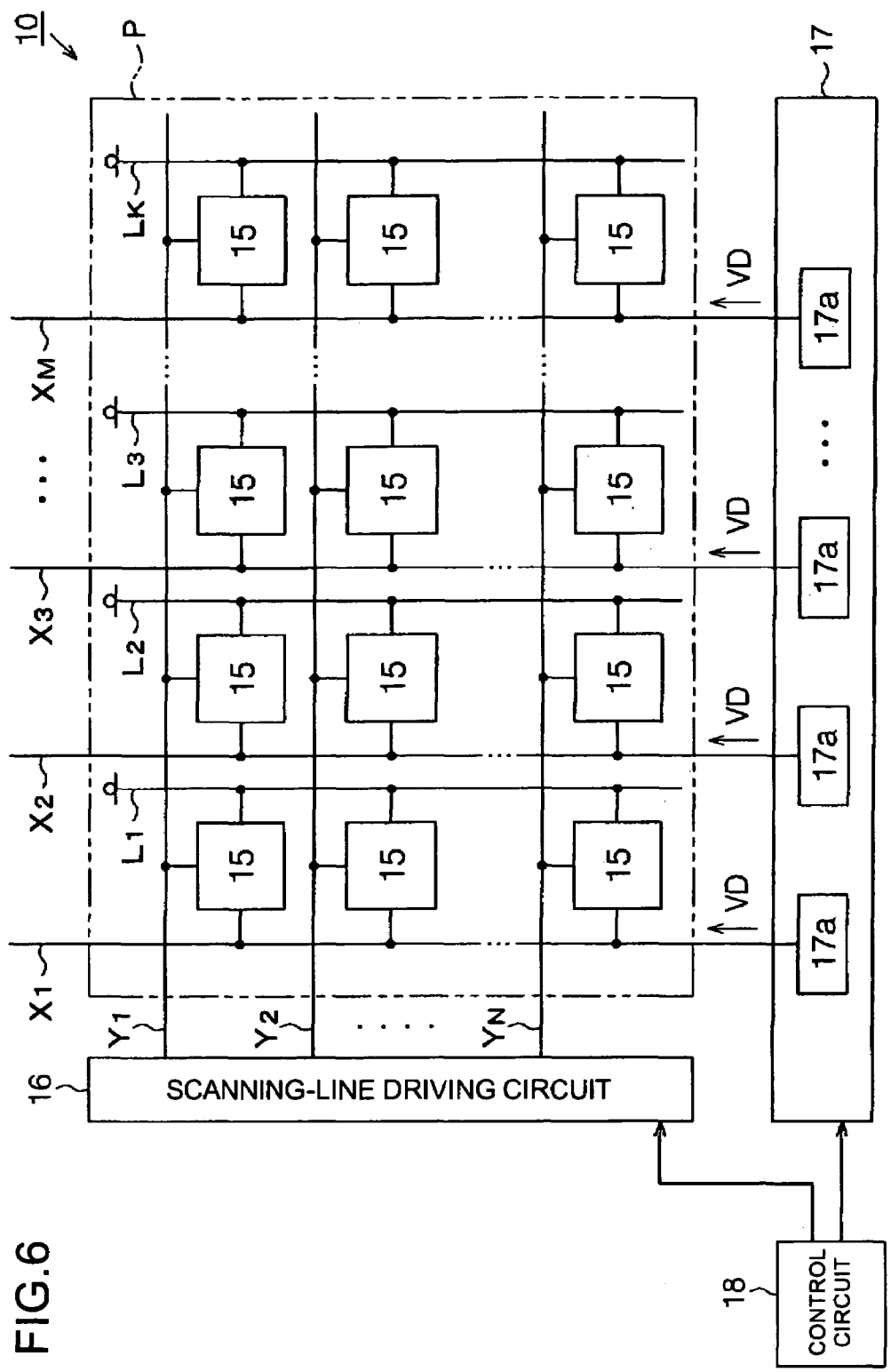
FIG. 6 is an electrically structural view of the organic EL display.

FIG. 6 shows the electrical structure of the organic EL display 10 structured in this way. In the organic EL display 10, the control circuit 18 generates a scanning control signal and a data control signal to display an image according to image data sent from an external apparatus, not shown. The control circuit 18 outputs the scanning control signal to the scanning-line driving circuit 16, and the data control signal to the data-line driving circuit 17.

In the data-line driving circuit 17, each single-line driver 17a generates a data signal VD according to the data-line control signal, and outputs the generated data signal VD to the corresponding data line Xm. The scanning-line driving circuit 16 selects and drives one of the plurality of scanning lines Yn according to the scanning control signal to select a one-row group of pixel circuits 15, and outputs a scanning signal to the selected group of pixel circuits 15 as a selection signal.

The scanning signal turns on the switching transistors Qs of the pixel circuits 15 on the selected scanning line Yn. Then, the holding capacitors Co hold the data signals VD sent from the single-line drivers 17a through the data lines Xm.

With this, the conductivity of each driving transistor Qd is controlled according to the data signal VD, and accordingly, the current level of driving current Ie1 sent to the organic EL element 11a is controlled. As a result, the organic EL element 11a emits light according to the data signal VD. Then, the desired image is displayed.

The first wiring lines, the selection lines, or the signal lines correspond to the scanning lines Yn, for example, in the present exemplary embodiment. The second wiring lines correspond to the data lines Xm, for example, in the present exemplary embodiment. The electronic apparatuses, or the electro-optic apparatuses, and the matrix substrates correspond to the organic EL display 10 and the substrate S, respectively, for example, in the present exemplary embodiment. The electronic elements, the electro-optic elements, or the elements driven by current correspond to the organic EL element 11a, for example, in the present exemplary embodiment. The signals or power correspond to the data signal VD, for example, in the present exemplary embodiment. The electronic circuits correspond to the pixel circuits 15, for example, in the present exemplary embodiment.

According to the organic EL display of the present exemplary embodiment, the following features are obtained.

In the present exemplary embodiment, the substrate S is formed of the element forming layer 12 in which the plurality of pixel circuits 15 are disposed in a matrix manner and the wiring layer 13 structured by the first wiring layer ID1 and the second wiring layer ID2 on the element forming layer 12. The data lines Xm adjacent to each other are alternately formed in the first wiring layer ID1 and the second wiring layer ID2. With this, the data lines Xm can be formed with their wiring pitch being made double, compared with a case in which all the data lines Xm are formed in one wiring layer.

Therefore, when the data lines Xm are formed, short circuits between data lines Xm formed adjacently to each other, caused by a mixture of impurities can be suppressed. As a result, the yields of the substrate S and the organic EL display 10 having the substrate S are enhanced.

SECOND EXEMPLARY EMBODIMENT

A second exemplary embodiment of the present invention will be described next by referring to FIG. 7 and FIG. 8. An organic EL display 10 according to the present exemplary embodiment is the same as that of the first embodiment except that the data lines Xm in the first exemplary embodiment are all formed in the first wiring layer ID1, and the scanning lines Yn in the first exemplary embodiment are alternately formed in the first wiring layer ID1 and the second wiring layer ID2 constituting the wiring layer 13. Therefore, in the present exemplary embodiment, the same symbols as those used in the first exemplary embodiment are assigned to the same structure members as those used in the first exemplary embodiment. A detailed description thereof is omitted.

Figure 7:
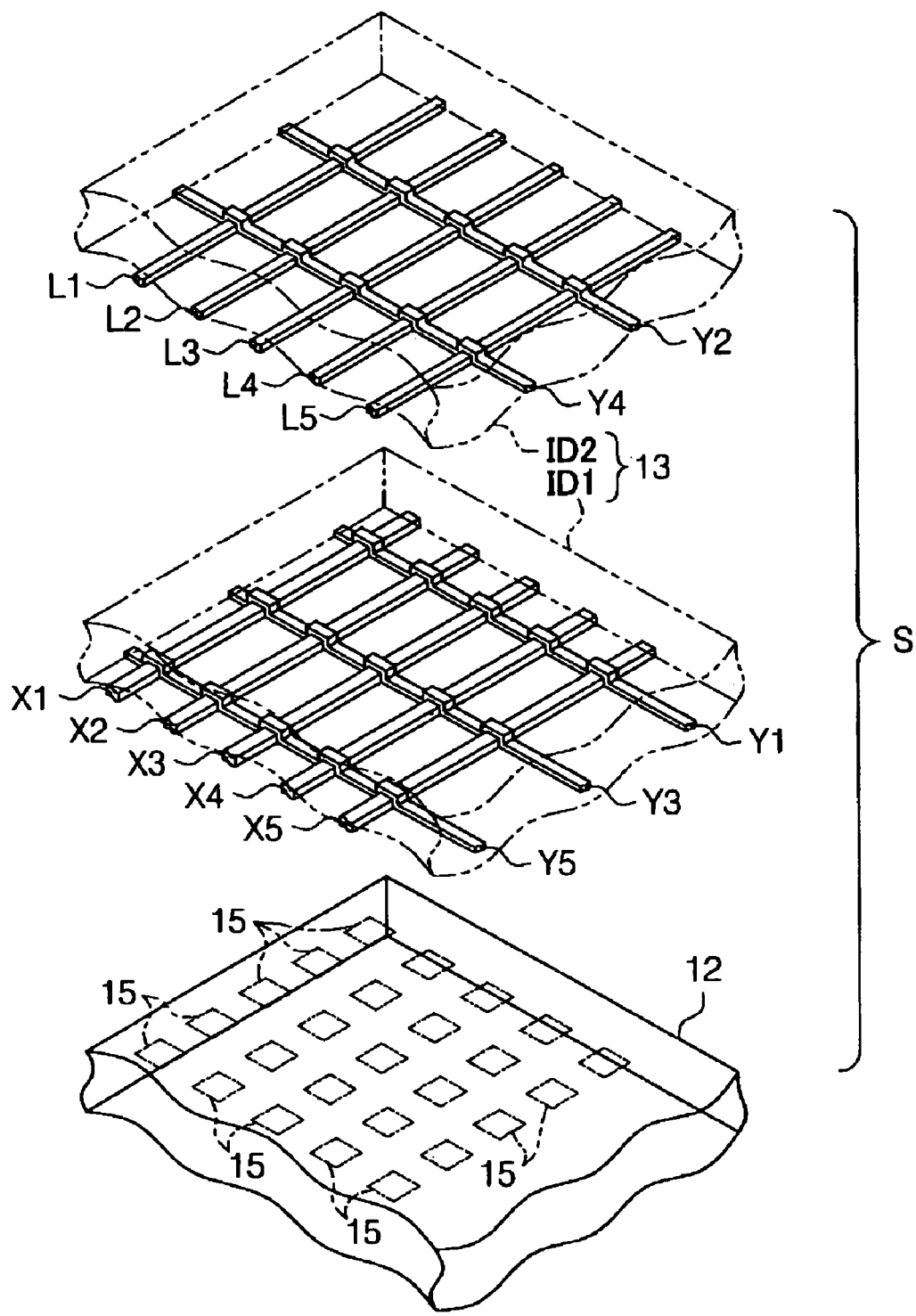
FIG. 7 is a partial exploded perspective view of a wiring forming layer and an element forming layer according to a second exemplary embodiment.

FIG. 7 is a partial exploded perspective view of a substrate S formed of a wiring layer 13 and an element forming layer 12 in the present exemplary embodiment. All data lines Xm in the present exemplary embodiment are formed in a first wiring layer ID1. All power lines Lk are formed in a second wiring layer ID2. Among a plurality of scanning lines Yn, a first scanning line Y1, a third scanning line Y3, a fifth scanning line Y5, . . . are formed in the first wiring layer ID1, and a second scanning line Y2, a fourth scanning line Y4, . . . are formed in the second wiring layer ID2.

In the element forming layer 12, the pixel circuits 15 are formed at the positions where the data lines Xm and the scanning lines Yn intersect.

Figure 8:
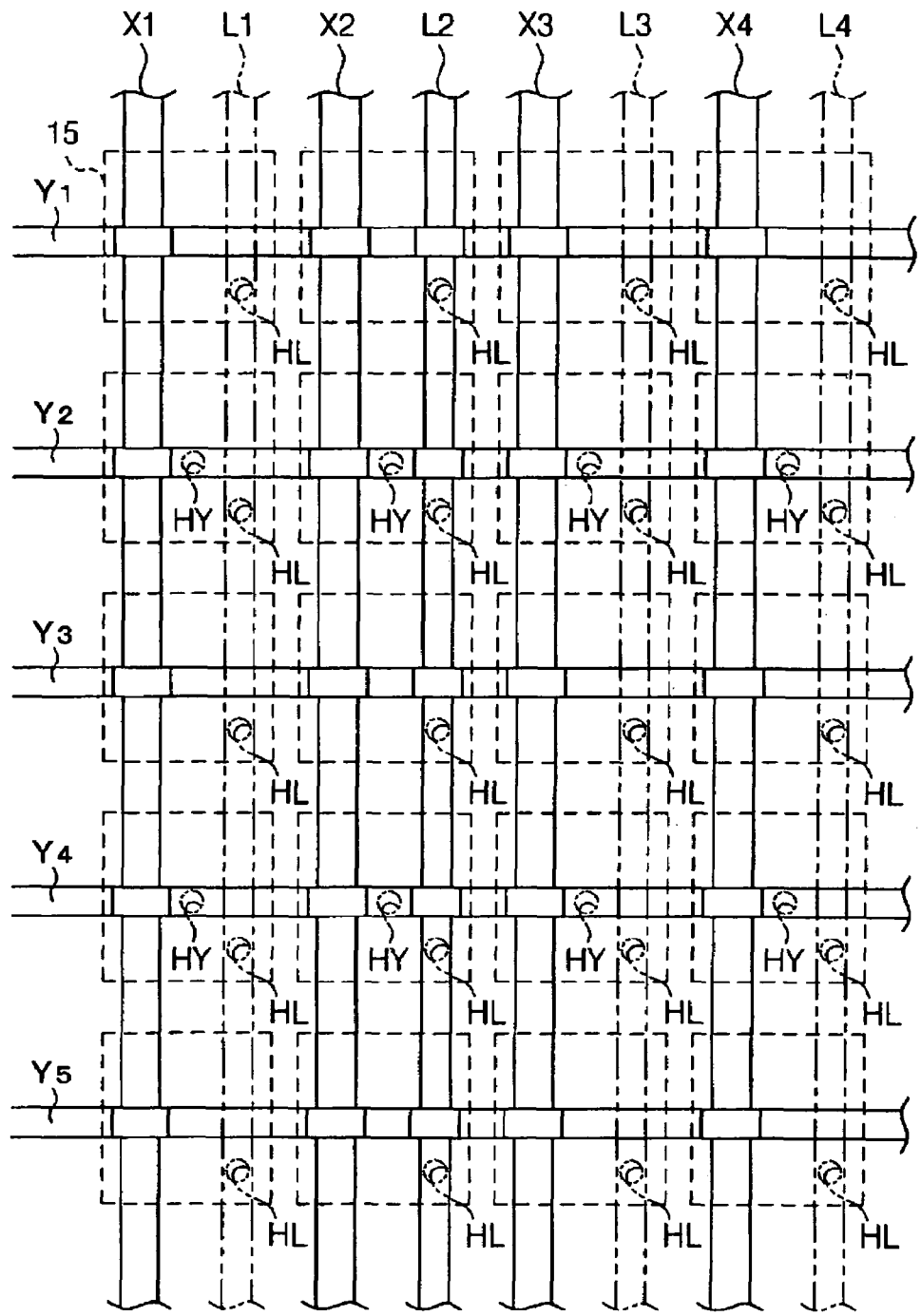
FIG. 8 is a partial top view of the wiring layer and the element forming layer according to the second exemplary embodiment.

FIG. 8 is a partial top view of the element forming layer 12 and the wiring layer 13 structured as described above. In FIG. 8, members indicated by solid lines are formed in the first wiring layer ID1, and members indicated by two-dot chain lines are formed in the second wiring layer ID2. Dotted lines indicate the positions of pixel circuits 15 formed in the element forming layer 12.

The second scanning line Y2, the fourth scanning line Y4, . . . formed in the second wiring layer ID2 have scanning-line contact holes HY formed through the first wiring layer ID1 at the positions corresponding to pixel circuits 15 formed in the element forming layer 12. The scanning-line contact holes HY are connected to the gates of the switching transistors Qs constituting the pixel circuits 15. With this, the second scanning line Y2, the fourth scanning line Y4, . . . formed in the second wiring layer ID2 are electrically connected to the corresponding pixel circuits 15.

When the substrate S and the organic EL display 10 having the substrate S are structured in this way, the scanning lines Yn formed adjacently to each other in the wiring layer 13 can be alternately formed in the first wiring layer ID1 and the second wiring layer ID2. As a result, the scanning lines Yn can be formed with their wiring pitch being made larger than in a case in which all the scanning lines Yn are formed in one wiring layer. Therefore, when the scanning lines Yn are formed, short circuits between scanning lines Yn formed adjacently to each other, caused by a mixture of impurities can be suppressed. As a result, the yields of the substrate S and the organic EL display 10 having the substrate S are enhanced.

THIRD EXEMPLARY EMBODIMENT

A third exemplary embodiment of the present invention will be described next by referring to FIG. 9 and FIG. 10. An organic EL display 10 according to the present exemplary embodiment is the same as that of the first exemplary embodiment except that the data lines Xm and the scanning lines Yn in the first exemplary embodiment are all formed in the first wiring layer ID1, and the power lines Lk in the first exemplary embodiment are alternately formed in the first wiring layer ID1 and the second wiring layer ID2 constituting the wiring layer 13. Therefore, in the present exemplary embodiment, the same symbols as those used in the first exemplary embodiment are assigned to the same structure members as those used in the first exemplary embodiment. A detailed description thereof is omitted.

Figure 9:
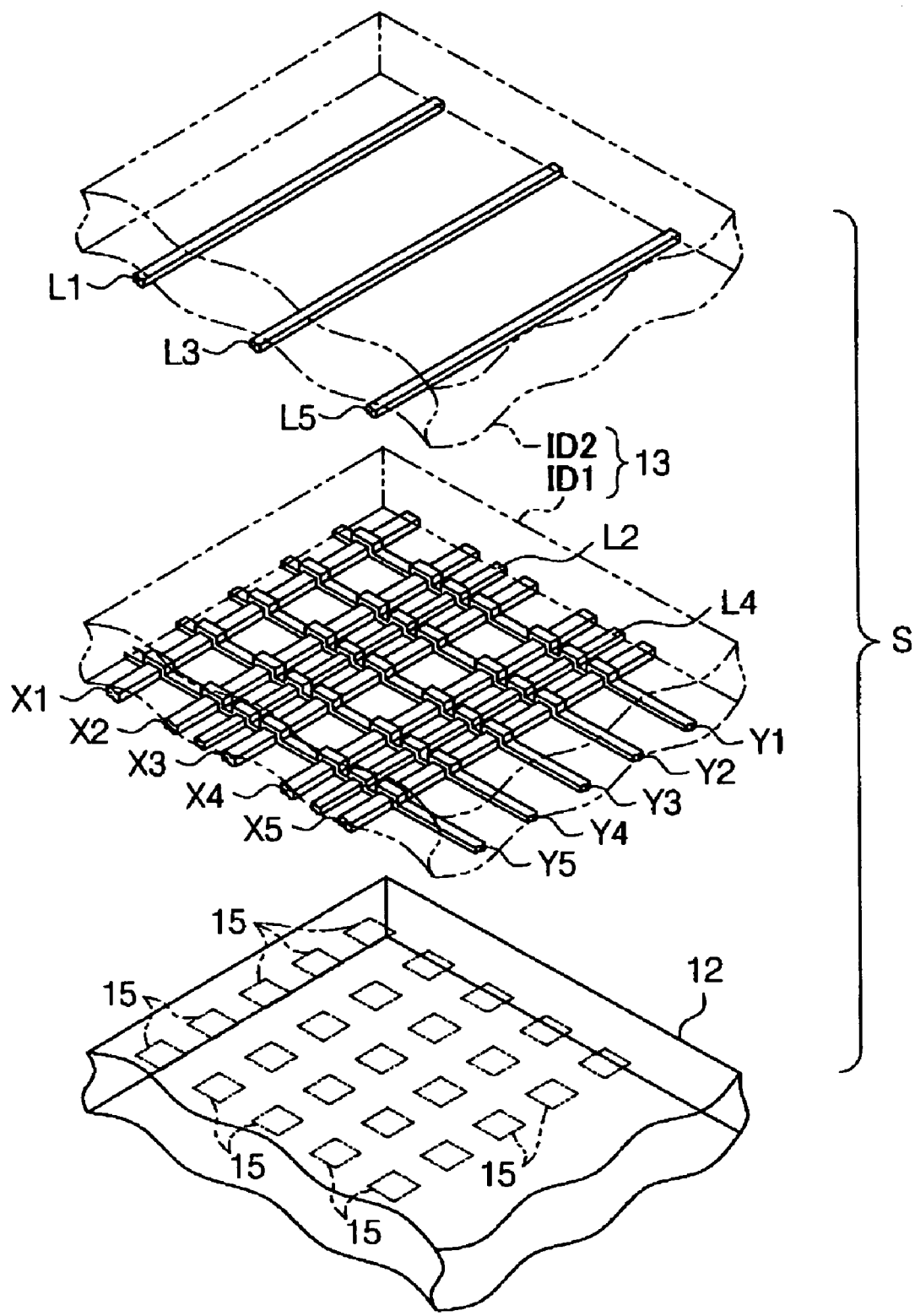
FIG. 9 is a partial exploded perspective view of a wiring forming layer and an element forming layer according to a third exemplary embodiment.

FIG. 9 is a partial exploded perspective view of a wiring layer 13 and an element forming layer 12 in the present exemplary embodiment. All of a plurality of data lines Xm and a plurality of scanning lines Yn in the present exemplary embodiment are formed in a first wiring layer ID1. Among a plurality of power lines Lk, a first power line L1, a third power line L3, a fifth power line L5, . . . are formed in the second wiring layer ID2, and a second power line L2, a fourth power line 1A, . . . are formed in the first wiring layer ID1.

Figure 10:
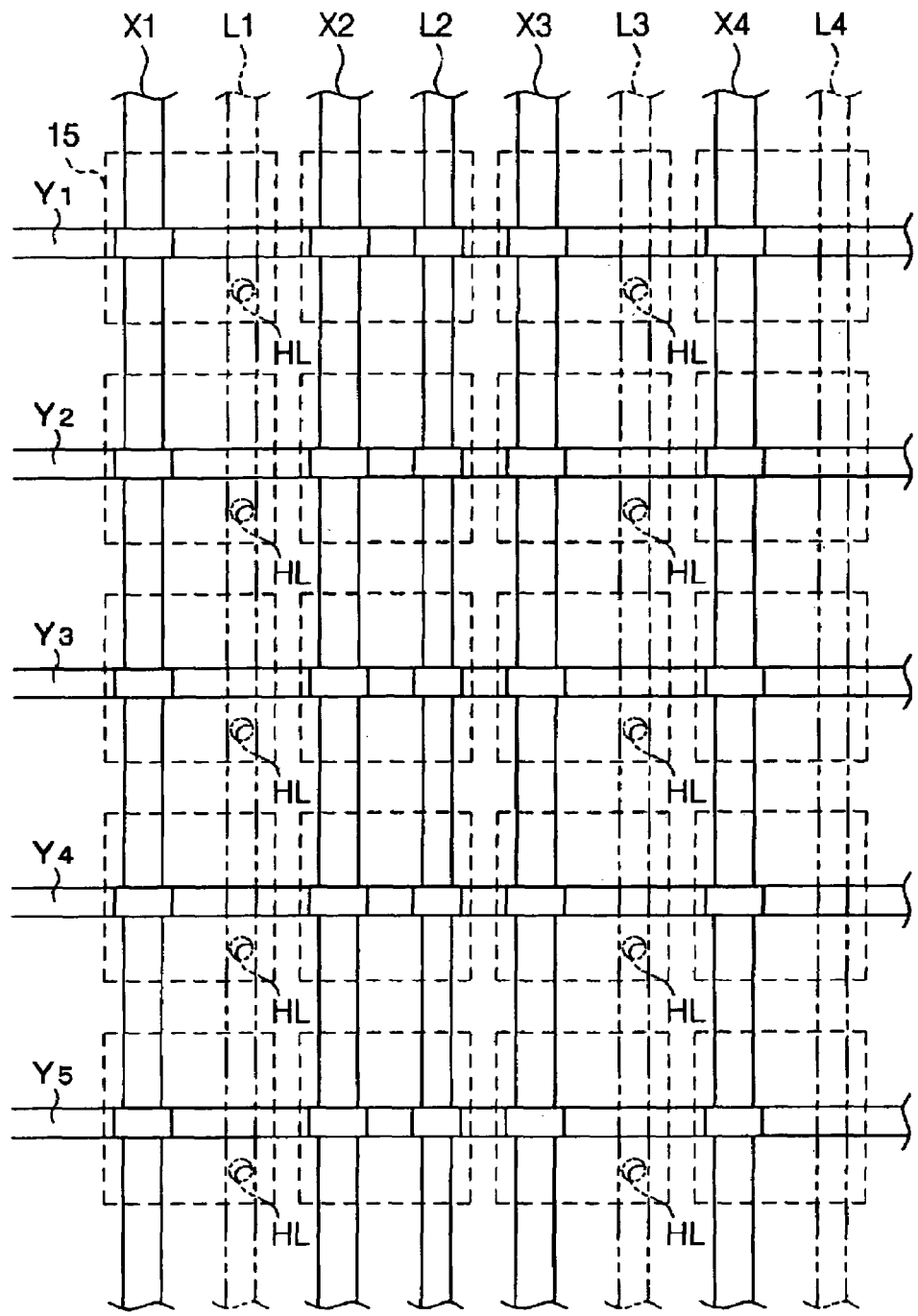
FIG. 10 is a partial top view of the wiring layer and the element forming layer according to the third exemplary embodiment.

FIG. 10 is a partial top view of the element forming layer 12 and the wiring layer 13. In FIG. 10, members indicated by solid lines are formed in the first wiring layer ID1, and members indicated by two-dot chain lines are formed in the second wiring layer ID2. Dotted lines indicate the positions of pixel circuits 15 formed in the element forming layer 12.

The first power lines L1, the third power lines L3, . . . formed in the second wiring layer ID2 are, as shown in FIG. 10, electrically connected to the sources of the driving transistors Qd constituting the corresponding pixel circuits 15 formed in the element forming layer 12, through power-line contact holes HL formed through the first wiring layer ID1. The second power line L2, the fourth power line L4, . . . formed on the first wiring layer ID1 are directly connected to the sources of the corresponding driving transistors Qd.

When the substrate S and the organic EL display 10 having the substrate S are structured in this way, the power lines Lk formed adjacently to each other are alternately formed in the first wiring layer ID1 and the second wiring layer ID2. As a result, the power lines Lk can be formed with their wiring pitch being made larger than in a case in which all the power lines Lk are formed in one wiring layer. Therefore, when the power lines Lk are formed, short circuits between power lines Lk formed adjacently to each other, caused by a mixture of impurities can be suppressed. As a result, the yields of the substrate S and the organic EL display 10 having the substrate S are enhanced.

FOURTH EXEMPLARY EMBODIMENT

An application of the organic EL displays 10 serving as electro-optic apparatuses, described in the first to third exemplary embodiments, to electronic units will be described next by referring to FIG. 11. The organic EL displays 10 can be applied to various electronic units, such as mobile personal computers, portable telephones, and digital cameras.

Figure 11:
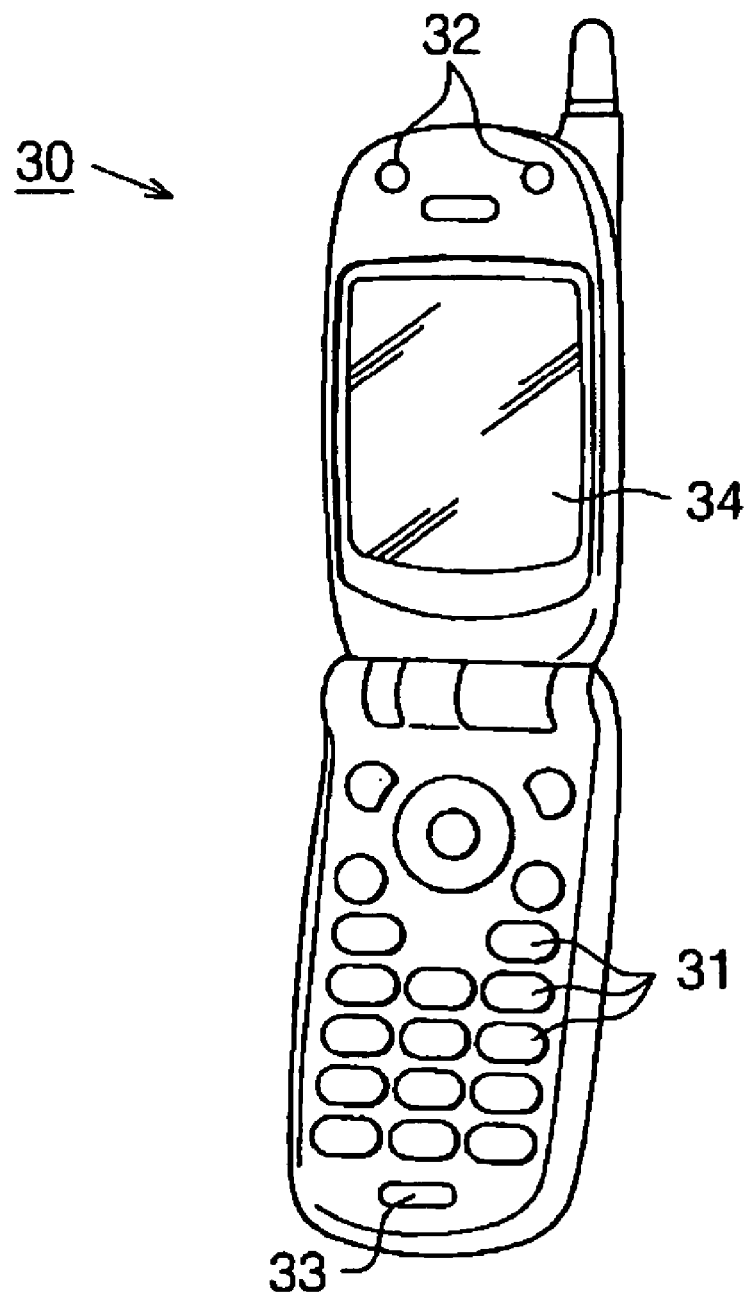
FIG. 11 is a perspective view showing the structure of a portable telephone, used for describing a fourth exemplary embodiment.

FIG. 11 is a perspective view showing the structure of a portable telephone. In FIG. 11, a portable telephone 30 is provided with a plurality of operation buttons 31, a receiver 32, a transmitter 33, and a display unit 34 which uses the organic EL display 10. As a result, the yield of the portable telephone 30 is enhanced.

Embodiments of the present invention are not limited to the above-described exemplary embodiments.

In the first, second, and third exemplary embodiments, the present invention is applied to the organic displays 10 serving as electronic apparatuses. The electronic apparatuses are not limited to the organic displays 10. The present invention may be applied to other electronic apparatuses.

In the first, second, and third exemplary embodiments, the data lines Xm, the scanning lines Yn, and the power lines Lk are alternately formed in the first wiring layer ID1 and the second wiring layer ID2 to make the wiring pitches of the data lines Xm, the scanning lines Yn, and the power lines Lk larger, respectively. Any of these exemplary embodiments may be combined.

In the first exemplary embodiment, for example, among the plurality of data lines Xm, the plurality of scanning lines Yn, and the plurality of power lines Lk, the data lines Xm are formed alternately in the first wiring layer ID1 and the second wiring layer ID2. And, all of the scanning lines are formed in the wiring layer ID1. In a modified case, the data lines Xm are formed alternately in the first wiring layer ID1 and the second wiring layer ID2, and the scanning lines Yn are also formed alternately in the first wiring layer ID1 and the second wiring layer ID2. With this, scanning lines Yn formed in the first wiring layer ID1 can be formed with their wiring pitch being made larger than in a case in which all the scanning lines Yn are formed in the first wiring layer ID1. Therefore, short circuits between the data lines Xm and the scanning lines Yn in the first wiring layer ID1 can be suppressed.

In each of the first to third exemplary embodiments, in the organic EL display 10, the scanning-line driving circuit 16, the data-line driving circuit 17, and the control circuit 18 are each structured by independent electronic components. The scanning-line driving circuit 16, the data-line driving circuit 17, and the control circuit 18 may be structured by a one-chip semiconductor integrated circuit apparatus. Alternatively, the whole or part of the scanning-line driving circuit 16, the data-line driving circuit 17, and the control circuit 18 may be integrated into an electronic component. With this, the same advantages as those in the first to third exemplary embodiments are obtained.

In the first to third exemplary embodiments, the pixel circuits 15 serve as electronic circuits, and the preferred advantages are obtained. For example, electronic circuits to drive elements driven by current, including light-emitting elements, such as LEDs and FEDs, may be used.

In the first to third exemplary embodiments, the organic EL elements 11a serve as elements driven by current. Inorganic EL elements may be used. In other words, the present invention may be applied to inorganic EL displays formed of inorganic EL elements.

What is claimed is:

1. A matrix substrate, comprising:
   a plurality of first wiring lines;
   a plurality of second wiring lines; and
   at least part of at least one first wiring line of the plurality of first wiring lines being formed in a layer different from a layer where the other first wiring lines of the plurality of first wiring lines are formed,
   at least part of at least one first wiring line being formed in the same layer as the plurality of second wiring lines, and
   at least one of either the plurality of first wiring lines or the plurality of second wiring lines being formed alternately in a plurality of different layers.

2. The matrix substrate according to claim 1,
   the plurality of first wiring lines and the plurality of second wiring lines being formed so as to intersect with each other.

3. The matrix substrate according to claim 1,
   at each of positions where the plurality of first wiring lines and the plurality of second wiring lines intersect, an electronic circuit connected to the first wiring line and the second wiring line being provided.

4. A matrix substrate, comprising:
   a plurality of scanning lines;
   a plurality of data lines; and
   at least part of at least one scanning line of the plurality of scanning lines being formed in a wiring layer different from a wiring layer where the other scanning lines are formed, and
   at least one of the plurality of scanning lines and the plurality of data being formed alternately in a plurality of different layers.

5. The matrix substrate according to claim 4,
   the plurality of scanning lines and the plurality of data lines being formed so as to intersect with each other.

6. The matrix substrate according to claim 4,
   at each of positions where the plurality of scanning lines and the plurality of data lines intersect, an electronic circuit connected to the scanning line and the data line being provided.

7. A matrix substrate, comprising:
   a plurality of scanning lines;
   a plurality of data lines; and
   at least part of at least one data line of the plurality of data lines being formed in a wiring layer different from a wiring layer where the other data lines are formed,
   and at least one of the plurality of scanning lines and the plurality of data lines being formed alternately in a plurality of different layers.

8. A matrix substrate, comprising:
   a plurality of scanning lines;
   a plurality of data lines;
   a plurality of power lines; and at least part of at least one power line of the plurality of power lines being formed in a wiring layer different from a wiring layer where the other power lines are formed, and at least one of the plurality of scanning lines, the plurality of data lines, and the plurality of power lines being formed alternately in a plurality of different layers.

9. An electronic apparatus, comprising:

a substrate provided with a plurality of first wiring lines;

a plurality of second wiring lines; and electronic elements driven by signals or power supplied through the plurality of first wiring lines, at least part of at least one first wiring line of the plurality of first wiring lines being formed in a layer different from a layer where the other first wiring lines are formed, at least part of at least one first wiring line being formed in the same layer as the plurality of second wiring lines, and at least either of the plurality of first wiring lines and the plurality of second wiring lines being formed alternately in a plurality of different wiring layers.

10. The electronic apparatus according to claim 9, the plurality of first wiring lines and the plurality of second wiring lines being formed so as to intersect with each other.

11. The electronic apparatus according to claim 9, at each of positions where the plurality of first wiring lines and the plurality of second wiring lines intersect, an electronic circuit connected to the first wiring line and the second wiring line, to control the electronic element being provided.

12. The electronic apparatus according to claim 11, the electronic circuits being formed in an element forming layer formed on the substrate, and the plurality of wiring layers being formed at the upper side of the element forming layer.

13. The electronic apparatus according to claim 12, the electronic elements being formed at the upper side of the plurality of wiring layers, correspondingly to the electronic circuits.

14. The electronic apparatus according to claim 9, the plurality of first wiring lines are signal lines, and the plurality of second wiring lines being power lines.

15. The electronic apparatus according to claim 14, the signal lines being selection lines to output selection signals to select the electronic circuits.

16. The electronic apparatus according to claim 15, the signal lines being data lines to output data signals to the electronic circuits.

17. The electronic apparatus according to claim 9, the electronic elements being electro-optic elements or elements driven by current.

18. An electronic unit including the electronic apparatus according to claim 9.

19. An electro-optic apparatus, comprising:

a plurality of scanning lines;

a plurality of data lines;

a plurality of power lines;

a plurality of electro-optic elements; and at least part of at least one scanning line of the plurality of scanning lines being formed in a layer different from a layer where the other scanning lines are formed, and at least any of the plurality of data lines, the plurality of scanning lines, and the plurality of power lines being formed alternately in a plurality of different wiring layers.

20. The electro-optic apparatus according to claim 19, the plurality of data lines and the plurality of scanning lines being formed so as to intersect with each other.

21. The electro-optic apparatus according to claim 19, at positions where the plurality of scanning lines and the plurality of data lines intersect, a plurality of electronic circuits connected to the scanning lines and the data lines, to control the electro-optic elements being provided.

22. The electro-optic apparatus according to claim 21, the plurality of electronic circuits being formed in an element forming layer formed on the substrate, and the plurality of wiring layers being formed at the upper side of the element forming layer.

23. The electro-optic apparatus according to claim 21, the plurality of electronic circuits are electronic circuits to drive the electro-optic elements formed correspondingly to the electronic circuits at the upper side of the plurality of wiring layers.

24. An electro-optic apparatus according to claim 19, the electro-optic elements being EL elements.

25. The electro-optic apparatus according to claim 24, the EL elements being organic EL elements in which light-emitting layers are made from an organic material.

26. An electronic unit including the electro-optic apparatus according to claim 19.

27. An electro-optic apparatus, comprising:

a plurality of scanning lines;

a plurality of data lines;

a plurality of power lines;

a plurality of electro-optic elements; and at least part of at least one data line of the plurality of data lines being formed in a layer different from a layer where the other data lines are formed, and at least any of the plurality of data lines, the plurality of scanning lines, and the plurality of power lines being formed alternately in a plurality of different wiring layers.

28. An electro-optic apparatus, comprising:

a plurality of scanning lines;

a plurality of data lines;

a plurality of power lines;

a plurality of electro-optic elements; and at least part of at least one power line of the plurality of power lines being formed in a layer different from a layer where the other power lines are formed, and at least any of the plurality of data lines, the plurality of scanning lines, and the plurality of power lines being formed alternately in a plurality of different wiring layers.

* * * * *